(12) United States Patent
Kazama et al.

(10) Patent No.: US 8,966,729 B2
(45) Date of Patent: Mar. 3, 2015

(54) METHOD FOR MANUFACTURING PIEZOELECTRIC ACTUATOR

(75) Inventors: Hironobu Kazama, Matsumoto (JP); Takahiro Kamijo, Matsumoto (JP); Masato Shimada, Chino (JP); Hiroyuki Kamei, Azumino (JP); Yuka Yonekura, Chino (JP); Motoki Takabe, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 1035 days.

(21) Appl. No.: 13/039,869

(22) Filed: Mar. 3, 2011

(65) Prior Publication Data

US 2011/0219592 A1    Sep. 15, 2011

(30) Foreign Application Priority Data

Mar. 10, 2010   (JP) .................................. 2010-052821

(51) Int. Cl.
| | |
|---|---|
| *B41J 2/16* | (2006.01) |
| *H01L 41/09* | (2006.01) |
| *H01L 41/187* | (2006.01) |
| *H01L 41/318* | (2013.01) |
| *H01L 41/314* | (2013.01) |
| *C23C 16/52* | (2006.01) |
| *H01L 21/3213* | (2006.01) |
| *H01L 21/3065* | (2006.01) |
| *B41J 2/14* | (2006.01) |

(52) U.S. Cl.
CPC ............. *B41J 2/1646* (2013.01); *B41J 2/1623* (2013.01); *B41J 2/161* (2013.01); *B41J 2/1626* (2013.01); *B41J 2/1632* (2013.01); *B41J 2/1635* (2013.01); *H01L 41/0973* (2013.01); *H01L 41/1876* (2013.01); *H01L 41/318* (2013.01); *H01L 41/314* (2013.01); *C23C 16/52* (2013.01); *H01L 21/32136* (2013.01); *H01L 21/3065* (2013.01); *B41J 2002/14241* (2013.01); *B41J 2002/14419* (2013.01)
USPC ............. 29/25.35; 29/890.1; 29/846; 347/68; 347/70; 204/192.32; 204/192.35

(58) Field of Classification Search
CPC ........ B41J 2/161; B41J 2/1623; B41J 2/1626; B41J 2/1632; B41J 2/1635; B41J 2/1646; B41J 2002/14241; B41J 2002/14419; H01L 41/0973; H01L 41/1876; H01L 41/314; H01L 21/32136; H01L 21/3065; C23C 16/52
USPC .......... 29/25.35, 890.1, 846, 847; 347/68–72; 204/192.32, 192.35; 216/60, 67
See application file for complete search history.

(56) References Cited

U.S. PATENT DOCUMENTS 5,679,213 A * 10/1997 Noshiro ............... 204/192.35 X
6,692,114 B2 * 2/2004 Takahashi ...................... 347/70

(Continued)

FOREIGN PATENT DOCUMENTS

JP          05169666 A  *  7/1993  ............... 29/890.1 X
JP     2002-026054         1/2002

(Continued)

*Primary Examiner* — A. Dexter Tugbang
(74) *Attorney, Agent, or Firm* — Workman Nydegger

(57) ABSTRACT

In sputter etching to improve the adhesion between upper electrodes and lead electrodes, the sputter etching of surfaces of the upper electrodes under an Ar gas flow at a flow rate of 60 sccm or more can reduce the residence time of Ar ions on the surfaces of the upper electrodes because of the Ar gas flow. This can prevent the charging of the upper electrodes due to the buildup of ionized Ar gas on the surfaces, reduce the influence of charging on piezoelectric elements, and provide a method for manufacturing a piezoelectric actuator that includes the piezoelectric elements each including a piezoelectric layer having small variations in hysteresis characteristics and deformation characteristics.

2 Claims, 13 Drawing Sheets

(56) References Cited

U.S. PATENT DOCUMENTS

2001/0019897 A1* 9/2001 Kumar et al. ........ 204/192.32 X
2004/0026368 A1* 2/2004 Barnes et al. .................. 216/60
2005/0233159 A1 10/2005 Fartash
2007/0033784 A1 2/2007 Li et al.
2007/0202695 A1 8/2007 Kawamura et al.

FOREIGN PATENT DOCUMENTS

| | | |
|---|---|---|
| JP | 2005-298975 | 10/2005 |
| JP | 2007-073931 | 3/2007 |
| JP | 2007-216429 | 8/2007 |
| JP | 2007-234667 | 9/2007 |

* cited by examiner

METHOD FOR MANUFACTURING PIEZOELECTRIC ACTUATOR

This application claims a priority to Japanese Patent Application No. 2010-052821 filed on Mar. 10, 2010 which is hereby expressly incorporated by reference herein in its entirety.

BACKGROUND

1. Technical Field

The present invention relates to a method for manufacturing a piezoelectric actuator that includes piezoelectric elements and lead electrodes on a diaphragm. The piezoelectric actuator includes individual electrodes and piezoelectric layers formed of a piezoelectric material. The lead electrodes are connected to the corresponding individual electrodes.

2. Related Art

Some known piezoelectric actuators include piezoelectric elements and lead electrodes on a diaphragm. Each of the piezoelectric elements includes a lower electrode, a piezoelectric layer, and an upper electrode. The lead electrodes are connected to electrodes of the piezoelectric elements. Some known piezoelectric elements include a piezoelectric layer formed of a piezoelectric material having an electromechanical transfer function, such as crystallized piezoelectric ceramic, between a lower electrode and an upper electrode.

Such piezoelectric actuators, called flexural vibration mode piezoelectric actuators, are used in liquid-ejecting heads, for example.

One example of liquid-ejecting heads is an ink jet recording head. The ink jet recording head has a diaphragm as a portion of a pressure-generating chamber. The pressure-generating chamber communicates with a nozzle opening through which ink droplets are ejected. A piezoelectric element deforms the diaphragm to pressurize ink in the pressure-generating chamber, thereby ejecting ink droplets from the nozzle opening.

Piezoelectric actuators and liquid-ejecting heads can be manufactured by forming a plurality of piezoelectric actuators and liquid-ejecting heads on a single wafer and subsequently dividing the wafer into piezoelectric actuators and liquid-ejecting heads.

One group of the electrodes of the piezoelectric element can serve as individual electrodes, and the other group can serve as a common electrode. JP-A-2007-73931 discloses an actuator in which upper electrodes serves as individual electrodes, and lead electrodes are formed on the upper electrodes.

JP-A-2007-234667 discloses a method for removing a natural oxidation film formed on a semiconductor substrate wafer by sputter etching.

In the formation of lead electrodes on individual electrodes, however, the sputter etching of the individual electrodes to remove contaminants from the individual electrodes may cause the buildup of electric charges on the isolated individual electrodes, resulting in charging.

The degree of charging varies with the piezoelectric actuator and the position in the wafer, affects the characteristics of each piezoelectric element, and causes variations in the hysteresis characteristics of a piezoelectric layer in each piezoelectric element. Variations in the hysteresis characteristics of a piezoelectric layer also cause variations in the deformation characteristics of the piezoelectric actuator.

SUMMARY

The invention has been achieved to solve the problems described above and can be implemented in accordance with the following embodiments or aspects.

First Aspect

A method for manufacturing a piezoelectric actuator, involving forming a diaphragm on a substrate, forming piezoelectric elements on the diaphragm, the piezoelectric elements including individual electrodes and piezoelectric layers, sputter-etching surfaces of the individual electrodes under an Ar gas flow at a flow rate in the range of 60 to 80 standard cubic centimeters per minute (sccm), and forming lead electrodes on the surfaces of the individual electrodes.

In accordance with this aspect, in sputter etching to improve the adhesion between the individual electrodes and the lead electrodes, the sputter etching of the surfaces of the individual electrodes under an Ar gas flow at a flow rate of 60 sccm or more can reduce the residence time of Ar ions on the surfaces of the individual electrodes because of the Ar gas flow. This can prevent the charging of the individual electrodes due to the buildup of ionized Ar gas on the surfaces, reduce the influence of charging on the piezoelectric elements, and provide a method for manufacturing a piezoelectric actuator that includes the piezoelectric elements each including a piezoelectric layer having small variations in hysteresis characteristics and deformation characteristics.

Furthermore, sputter etching under an Ar gas flow at a flow rate of 80 sccm or less can limit the etching amount, thereby reducing variations in the etching amounts of piezoelectric actuators.

Second Aspect

A method for manufacturing a piezoelectric actuator, involving forming a lower electrode on a diaphragm as a common electrode, forming piezoelectric layers on the lower electrode or on the diaphragm, and forming upper electrodes on the piezoelectric layers as individual electrodes.

This aspect provides a method for manufacturing a piezoelectric actuator having advantages described above. The piezoelectric actuator includes a lower electrode on a diaphragm as a common electrode and upper electrodes on piezoelectric layers as individual electrodes.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments will be described in detail below with reference to the drawings.

Figure 1:
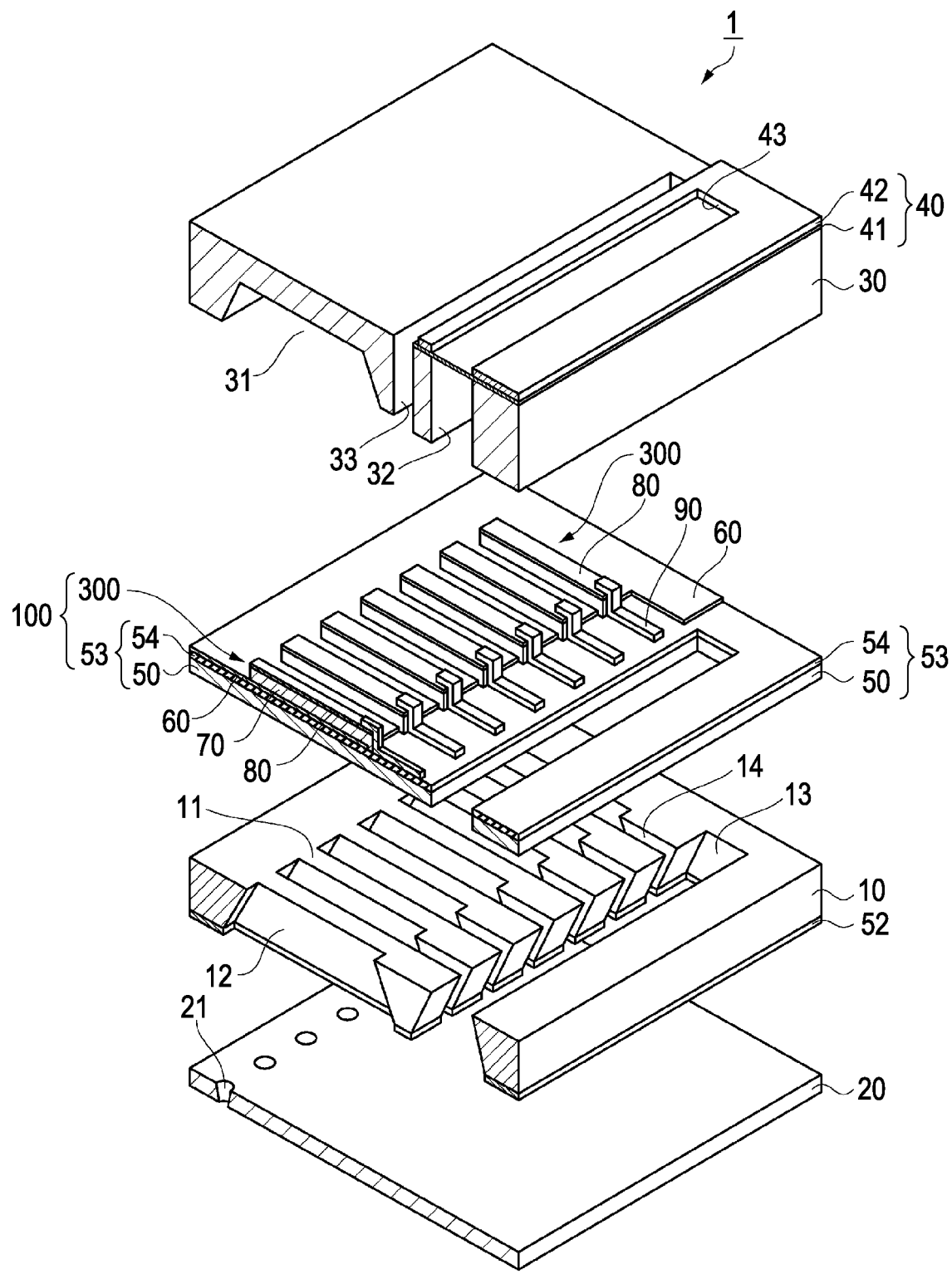
FIG. 1 is an exploded perspective view of an ink jet recording head.
Figure 2A:
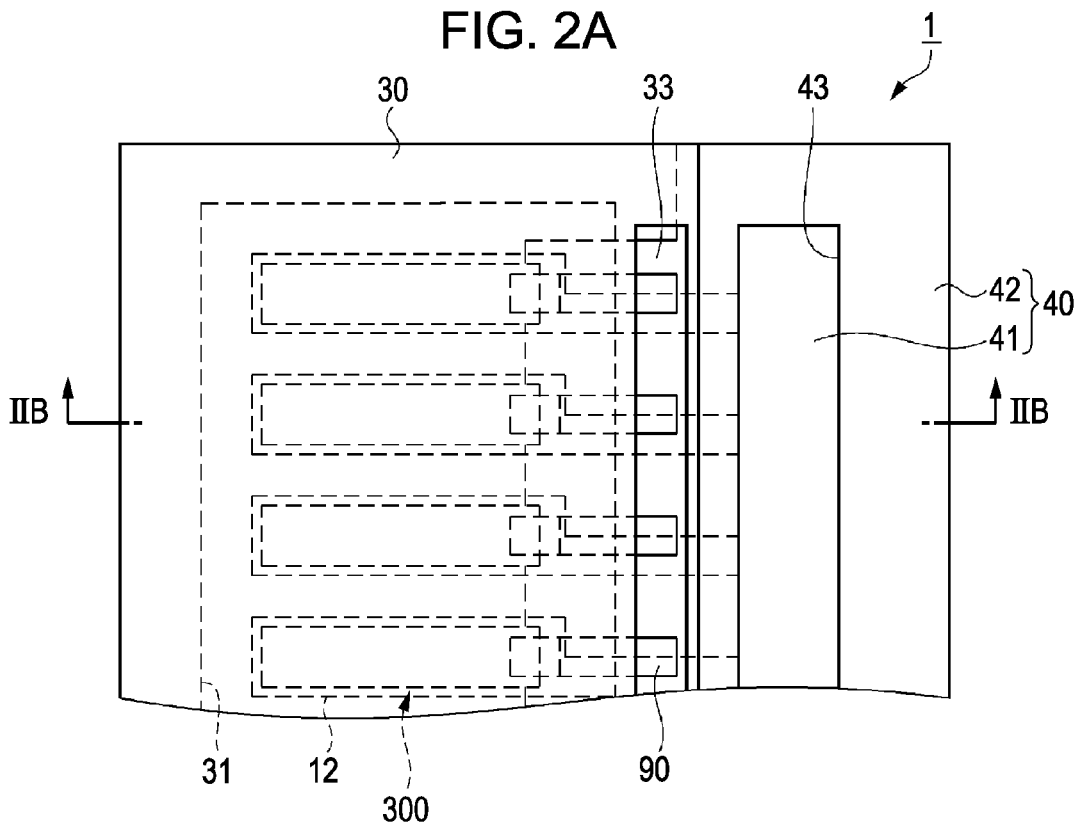
FIG. 2A is a fragmentary plan view of the ink jet recording head.
Figure 2B:
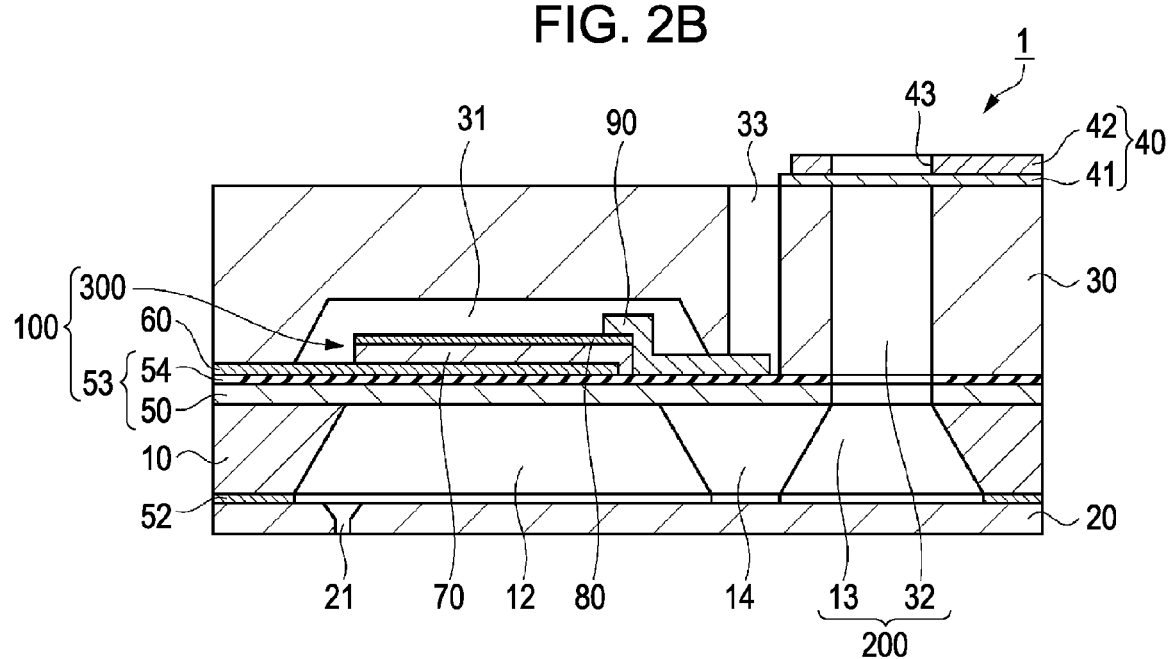
FIG. 2B is a cross-sectional view of the ink jet recording head taken along the line IIB-IIB in FIG. 2A.

FIG. 1 is an exploded perspective view of an ink jet recording head 1 that includes a piezoelectric actuator 100 according to an embodiment of the invention. FIG. 2A is a fragmentary plan view of the ink jet recording head 1. FIG. 2B is a cross-sectional view of the ink jet recording head 1 taken along the line IIB-IIB in FIG. 2A.

With reference to FIGS. 1, 2A and 2B, the ink jet recording head 1 includes a flow-passage-forming substrate 10, a nozzle plate 20, and a protective substrate 30. The flow-passage-forming substrate 10 is disposed between the nozzle plate 20 and the protective substrate 30.

The flow-passage-forming substrate 10 is a silicon single crystal substrate having a (110) plane orientation. An elastic film 50 formed by thermal oxidation is disposed on one side of the flow-passage-forming substrate 10.

The flow-passage-forming substrate 10 includes a plurality of pressure-generating chambers 12 separated by partitions 11. The flow-passage-forming substrate 10 also includes a communication portion 13 outside the pressure-generating chambers 12 in the longitudinal direction of the pressure-generating chambers 12. The communication portion 13 is in communication with the pressure-generating chambers 12 through corresponding ink feed channels 14.

The communication portion 13 in communication with the protective substrate 30 constitutes a manifold 200. The manifold 200 serves as a common ink chamber for the pressure-generating chambers 12. The ink feed channels 14 have a smaller width than the pressure-generating chambers 12, producing a constant flow resistance against ink flowing from the communication portion 13 to the pressure-generating chambers 12.

The bottom surface of the flow-passage-forming substrate 10 is attached to the nozzle plate 20 with an adhesive, a heat-seal film, or the like with a mask film 52 interposed therebetween. The nozzle plate 20 has nozzle openings 21 in communication with the corresponding ends of the pressure-generating chambers 12 opposite the ink feed channels 14. The nozzle plate 20 is formed of glass ceramic, silicon single crystal, or stainless steel, for example.

The top surface of the flow-passage-forming substrate 10 is attached to a piezoelectric actuator 100. The piezoelectric actuator 100 includes a diaphragm 53 and piezoelectric elements 300, which are drive units.

The diaphragm 53 includes the elastic film 50, for example, having a thickness of approximately 1.0 μm and an insulator film 54 disposed on the elastic film 50. The insulator film 54 is formed of zirconium oxide and has a thickness of approximately 0.35 μm.

The piezoelectric elements 300 face the pressure-generating chambers 12 through the diaphragm 53.

The piezoelectric elements 300 are disposed on the insulator film 54. The piezoelectric elements 300 include a lower electrode 60, for example, having a thickness of approximately 0.1 to 0.2 μm, piezoelectric layers 70, for example, each having a thickness of approximately 0.5 to 5 μm, and upper electrodes 80, for example, each having a thickness of approximately 0.05 μm.

In general, one of the two electrodes of each of the piezoelectric elements 300 serves as a common electrode, and the other electrode and the piezoelectric layer 70 correspond to each of the pressure-generating chambers 12. In the present embodiment, the lower electrode 60 serves as the common electrode for the piezoelectric elements 300, and the upper electrodes 80 serve as individual electrodes of the piezoelectric elements 300. Depending on the drive circuit or wiring, however, lower electrodes may serve as individual electrodes and an upper electrode may serve as a common electrode.

The piezoelectric actuator 100 includes lead electrodes 90. The upper electrode 80 of each of the piezoelectric elements 300 is connected to a corresponding one of the lead electrodes 90, which may be formed of gold (Au). A voltage is selectively applied to the individual piezoelectric elements 300 through the corresponding lead electrodes 90.

The flow-passage-forming substrate 10 is attached to the protective substrate 30, for example, with an adhesive. The protective substrate 30 has a piezoelectric element housing space 31 for protecting the piezoelectric elements 300. As long as the piezoelectric element housing space 31 has such a space that allows the deformation of the piezoelectric elements 300, the space may be sealed or not.

The protective substrate 30 includes a reservoir portion 32 facing the communication portion 13 in the flow-passage-forming substrate 10. The reservoir portion 32 in communication with the communication portion 13 constitutes the manifold 200. The manifold 200 serves as the common ink chamber for the pressure-generating chambers 12.

A through-hole 33 passes through the protective substrate 30 in the thickness direction between the piezoelectric element housing space 31 and the manifold 200. Part of the lower electrode 60 and a tip of each of the lead electrodes 90 are exposed in the through-hole 33. The lower electrode 60 and each of the lead electrodes 90 are connected to a connecting wire extending from a drive IC (not shown).

The protective substrate 30 is preferably formed of a material having substantially the same thermal expansion coefficient as the flow-passage-forming substrate 10, for example, glass, ceramic, or silicon single crystal.

The protective substrate 30 is attached to a compliance substrate 40. The compliance substrate 40 includes a sealing film 41 and a fixing sheet 42. The sealing film 41 is formed of a flexible, low-rigidity material (for example, a poly(phenylene sulfide) (PPS) film having a thickness of 6 μm) and seals one side of the reservoir portion 32.

The fixing sheet 42 is formed of a hard material, such as metal, and may be a stainless steel (SUS) sheet having a thickness of 30 μm. The fixing sheet 42 has an opening 43 on top of the manifold 200. Thus, one side of the manifold 200 is sealed with the flexible sealing film 41 alone.

The ink jet recording head 1 is supplied with ink from an ink supply unit (not shown). After the manifold 200 to the nozzle openings 21 are filled with the ink, a voltage is applied between the lower electrode 60 and the upper electrodes 80 of the pressure-generating chambers 12 in accordance with a recording signal from the drive IC. The application of the voltage deforms the elastic film 50 and the piezoelectric layer 70 to increase the pressure within the pressure-generating chambers 12, thereby ejecting ink droplets from the nozzle openings 21.

A method for manufacturing the ink jet recording head 1 will be described below with reference to FIG. 3 to FIG. 7L with a focus on a method for manufacturing the piezoelectric actuator 100.

Figure 3:
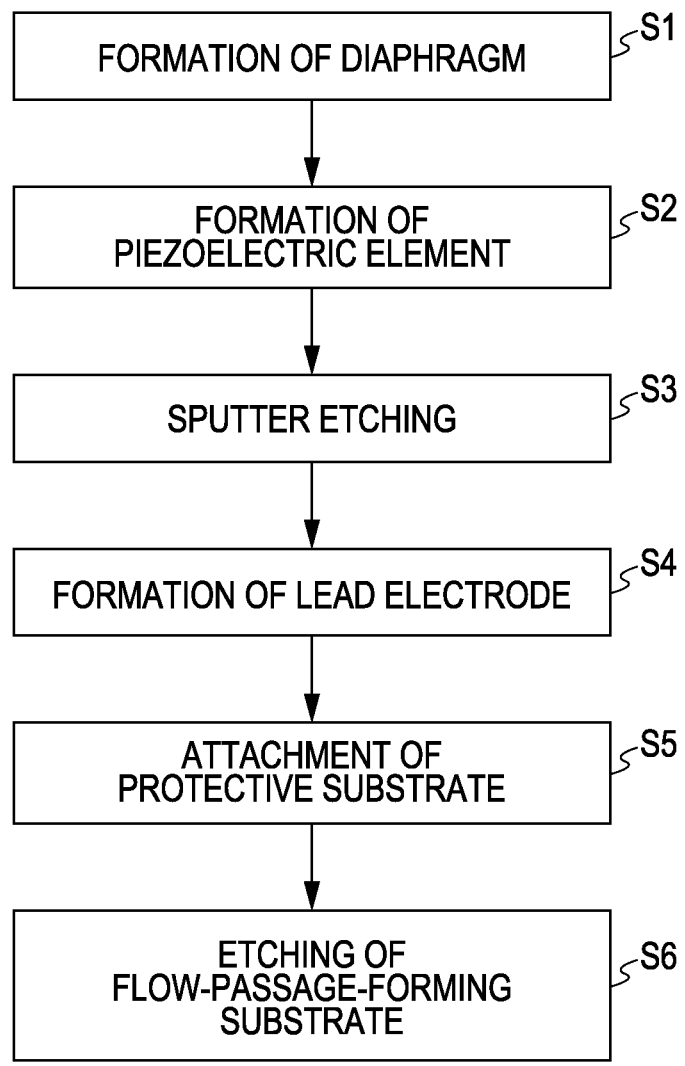
FIG. 3 is a flow chart of a method for manufacturing an ink jet recording head.

FIG. 3 is a flow chart illustrating a method for manufacturing the ink jet recording head 1. FIGS. 4A to 7L are longitudinal cross-sectional views of a pressure-generating chamber 12.

With reference to FIG. 3, a method for manufacturing the ink jet recording head 1 includes a step 1 (S1) of forming a diaphragm, a step 2 (S2) of forming piezoelectric elements, a step 3 (S3) of sputter etching, a step 4 (S4) of forming lead electrodes, a step 5 (S5) of attaching a protective substrate, and a step 6 (S6) of etching a flow-passage-forming substrate.

A method for manufacturing the piezoelectric actuator 100 includes the step 1 (S1) of forming a diaphragm, the step 2 (S2) of forming piezoelectric elements, the step 3 (S3) of sputter etching, and the step 4 (S4) of forming lead electrodes.

Figure 4A:
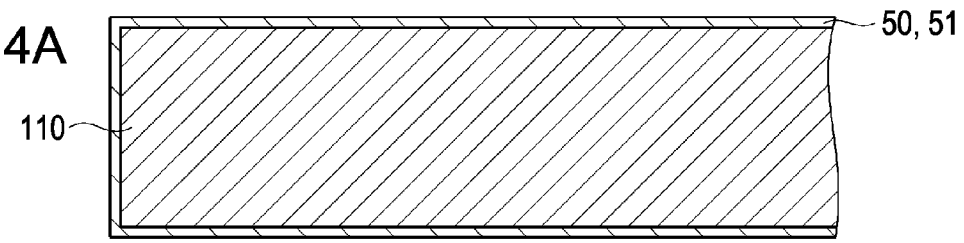
FIG. 4A is a cross-sectional view of a pressure-generating chamber in the longitudinal direction, illustrating a method for manufacturing an ink jet recording head.
Figure 4A:
Figure 4B:
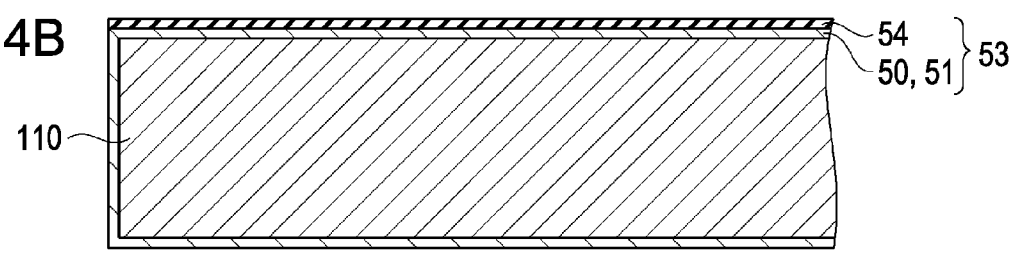
FIG. 4B is a cross-sectional view of a pressure-generating chamber in the longitudinal direction, illustrating a method for manufacturing an ink jet recording head.
Figure 4B:

FIGS. 4A and 4B illustrate the step 1 (S1) of forming a diaphragm.

With reference to FIG. 4A, a flow-passage-forming substrate wafer 110 formed of silicon is thermally oxidized in a diffusion furnace at approximately 1100° C. to form a silicon dioxide film 51 on the surface of the flow-passage-forming substrate wafer 110. The silicon dioxide film 51 constitutes the elastic film 50. The flow-passage-forming substrate wafer 110 may be a rigid silicon wafer having a relatively large thickness of approximately 625 μm.

With reference to FIG. 4B, a zirconium oxide ($ZrO_2$) insulator film 54 is formed on the silicon dioxide film 51 on one side of the flow-passage-forming substrate wafer 110. More specifically, a zirconium (Zr) layer is formed on the silicon dioxide film 51, for example, by sputtering. The zirconium layer is thermally oxidized in a diffusion furnace at a temperature, for example, in the range of 500° C. to 1200° C. to form the zirconium oxide insulator film 54. The elastic film 50 and the insulator film 54 constitute the diaphragm 53.

FIGS. 4C to 5F illustrate the step 2 (S2) of forming piezoelectric elements.

Figure 4C:
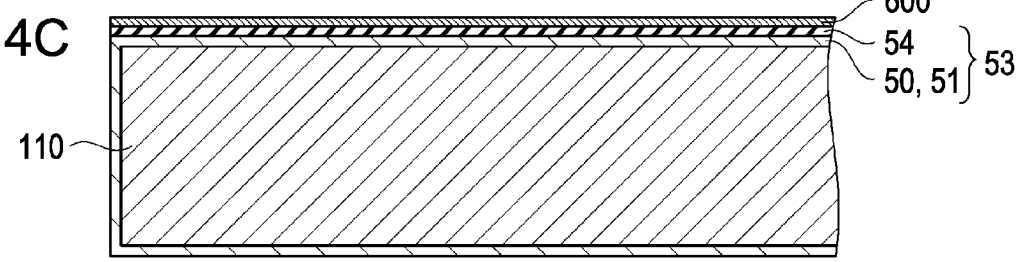
FIG. 4C is a cross-sectional view of a pressure-generating chamber in the longitudinal direction, illustrating a method for manufacturing an ink jet recording head.
Figure 4C:

With reference to FIG. 4C, a lower electrode film 600, for example, formed of platinum (Pt) or iridium (Ir) is formed over the entire surface of the insulator film 54 and is patterned in a predetermined shape.

Figure 4D:
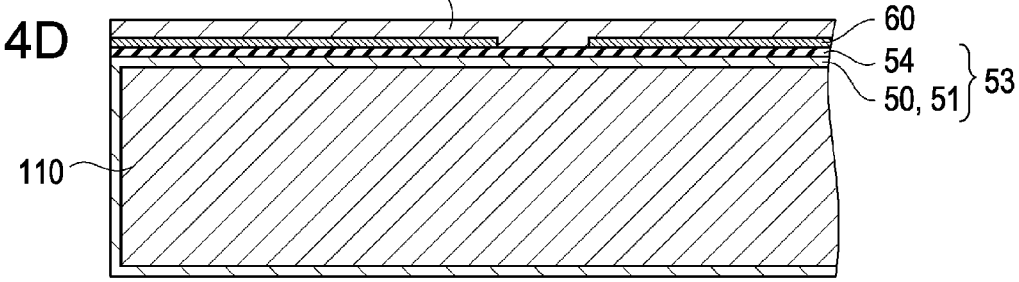
FIG. 4D is a cross-sectional view of a pressure-generating chamber in the longitudinal direction, illustrating a method for manufacturing an ink jet recording head.
Figure 4D:

For example, an iridium film and a platinum film layered by sputtering are patterned in a predetermined shape to form the lower electrodes 60, as illustrated in FIG. 4D.

With reference to FIG. 4D, a piezoelectric layer film 700 formed of a piezoelectric material is formed on the lower electrode 60 and the insulator film 54. Examples of the piezoelectric material include, but are not limited to, lead zirconium titanate (PZT).

The piezoelectric layer film 700 may be formed by a sol-gel method in the following manner. A sol of an organometallic compound dissolved or dispersed in a solvent is applied to the lower electrode 60 and the insulator film 54, is dried for gelation, and is fired at a high temperature to form the piezoelectric layer film 700 formed of a metal oxide.

The method of forming the piezoelectric layer film 700 is not limited to the sol-gel method and may be a metal-organic decomposition (MOD) method.

The sol-gel method will be described in detail. First, a sol (solution) containing an organometallic compound is applied. The resulting piezoelectric precursor film is then heated at a predetermined temperature for a predetermined period of time to evaporate the solvent. The piezoelectric precursor film is then degreased in the atmosphere at a predetermined temperature for a predetermined period of time.

The term "degrease", as used herein, means that organic components of a sol layer are removed as $NO_2$, $CO_2$, and/or $H_2O$, for example.

The application, drying, and degreasing are performed predetermined times (for example, twice) to form a piezoelectric precursor film having a predetermined thickness. The piezoelectric precursor film is heat-treated in a diffusion furnace for crystallization, yielding a piezoelectric film. In other words, the piezoelectric precursor film is fired to grow crystals, thereby forming the piezoelectric film.

The firing temperature preferably ranges from approximately 650° C. to 850° C. For example, the piezoelectric precursor film is fired at approximately 700° C. for 30 minutes to form the piezoelectric film. The crystals of the piezoelectric film formed under such conditions have a (100) preferred orientation.

The application, drying, degreasing, and firing are performed twice or more to form the multilayer piezoelectric layer film 700 having a predetermined thickness.

Examples of the material for the piezoelectric layer film 700 include, but are not limited to, ferroelectric piezoelectric materials, such as lead zirconium titanate, containing metal, such as niobium, nickel, magnesium, bismuth, or yttrium, and relaxor ferroelectrics.

Figure 5E:
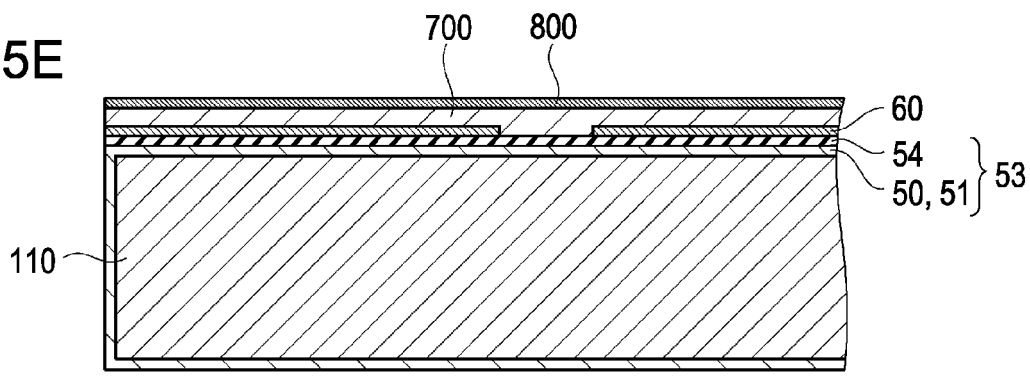
FIG. 5E is a cross-sectional view of a pressure-generating chamber in the longitudinal direction, illustrating a method for manufacturing an ink jet recording head.

With reference to FIG. 5E, after the piezoelectric layer film 700 is formed, an upper electrode film 800, for example, formed of iridium or gold (Au) is formed over the entire surface of the piezoelectric layer film 700. The upper electrode film 800 may be formed by sputtering, such as DC or RF sputtering.

Figure 5F:
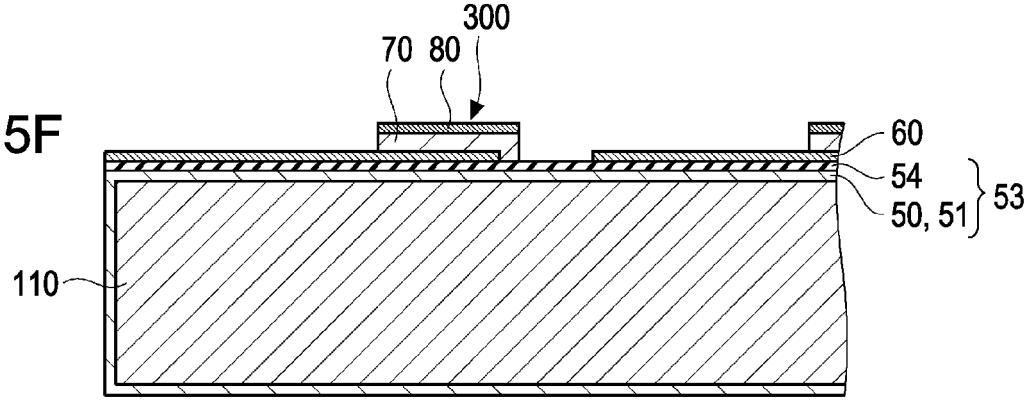
FIG. 5F is a cross-sectional view of a pressure-generating chamber in the longitudinal direction, illustrating a method for manufacturing an ink jet recording head.

With reference to FIG. 5F, the piezoelectric layer film 700 and the upper electrode film 800 are patterned to form the piezoelectric elements 300 corresponding to the pressure-generating chambers 12 illustrated in FIGS. 1, 2A, and 2B.

Figure 5G:
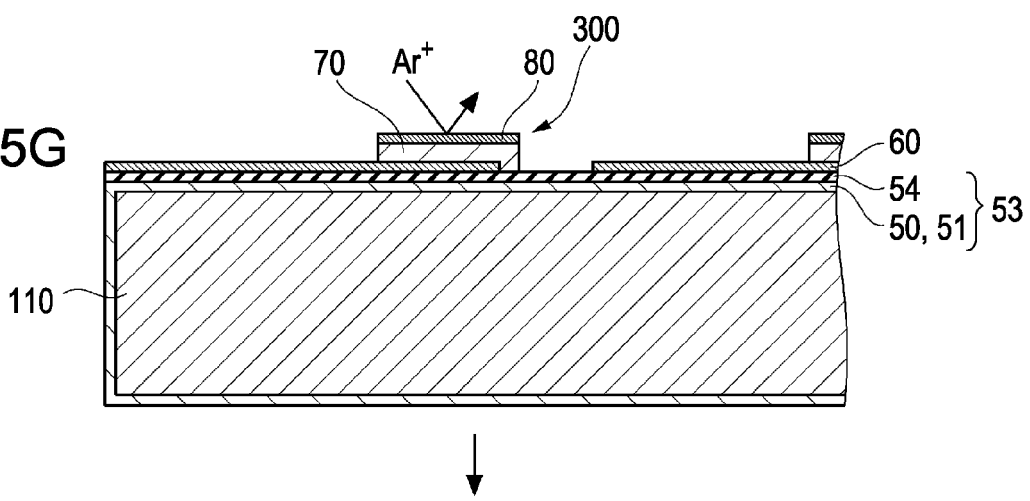
FIG. 5G is a cross-sectional view of a pressure-generating chamber in the longitudinal direction, illustrating a method for manufacturing an ink jet recording head.
Figure 8:
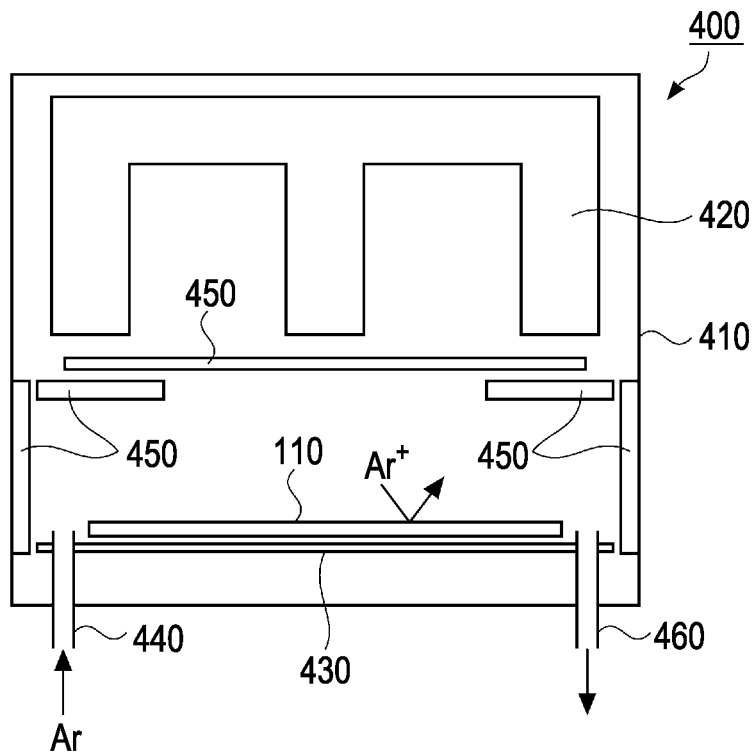
FIG. 8 is a schematic view of a sputter etching apparatus.

With reference to FIG. 5G, in the step 3 (S3) of sputter etching, the surfaces of the upper electrodes 80 is sputter-etched to remove contaminants from the surface. FIG. 8 is a schematic view of a sputter etching apparatus 400.

The sputter etching apparatus 400 includes a chamber 410 and a magnetic coil 420.

The magnetic coil 420 is disposed on one side of the chamber 410. A quartz ring 430 is disposed on the other side of the chamber 410. The flow-passage-forming substrate wafer 110 on which the elastic film 50 to the upper electrodes 80 are formed is mounted on the quartz ring 430. Anti-adhesion plates 450 for preventing the adhesion of sputtered substances on the chamber 410 and the magnetic coil 420 are disposed on the inner wall of the chamber 410 and between the magnetic coil 420 and the flow-passage-forming substrate wafer 110.

A gas is introduced into the chamber 410 as described below.

A gas inlet 440 is disposed on the periphery of the quartz ring 430. A gas outlet 460 of the chamber 410 is disposed opposite to the gas inlet 440 on the quartz ring 430.

A gas flows from the gas inlet 440 to the gas outlet 460 in the chamber 410.

For example, Ar gas can be used in the sputter etching of the surfaces of the upper electrodes 80. The pressure within the chamber 410 depends on the exhaust capacity of the sputter etching apparatus 400. Preferably, the pressure within the chamber 410 is kept in the range of 0.5 to 1.5 Pa at an Ar gas flow rate in the range of 60 to 80 sccm.

Figure 9:
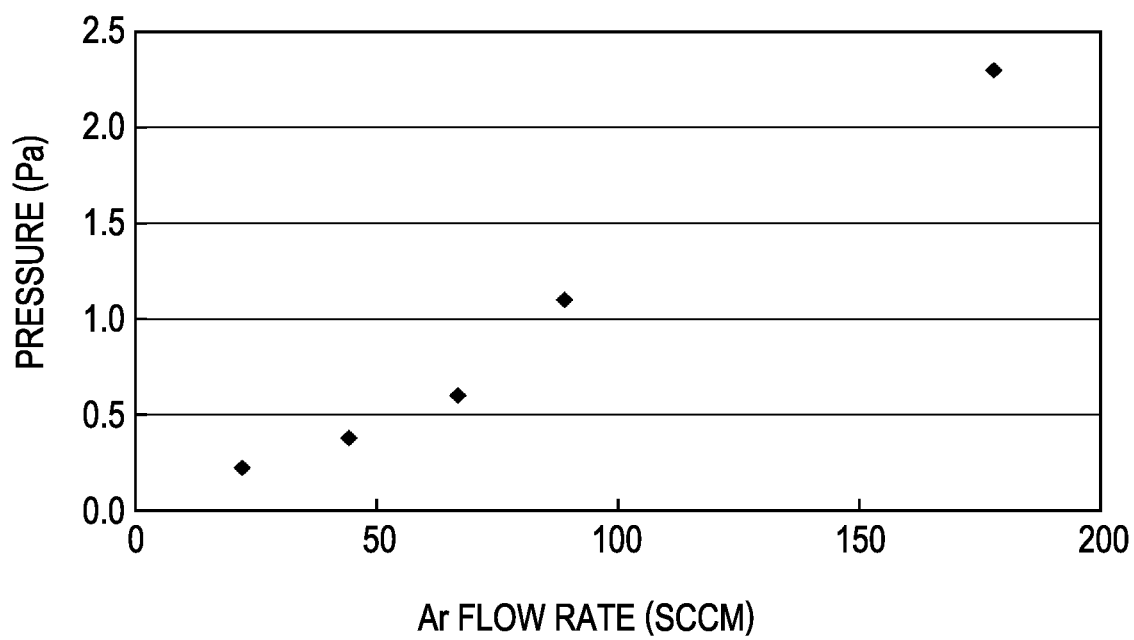
FIG. 9 is a graph showing the relationship between the Ar gas flow rate in a sputter etching apparatus and the pressure within the chamber.

FIG. 9 is a graph showing the relationship between the Ar gas flow rate and the pressure within the chamber in the sputter etching apparatus 400 used in the examples. The pressure within the chamber increases with increasing Ar gas flow rate. Although the relationship between the Ar gas flow rate and the pressure within the chamber depends on the exhaust capacity of the sputter etching apparatus 400, it is important to control the Ar gas flow rate.

Figure 6H:
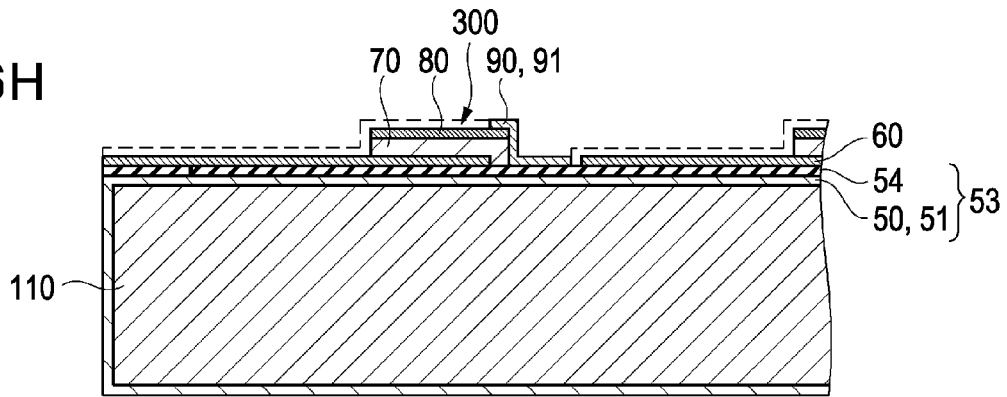
FIG. 6H is a cross-sectional view of a pressure-generating chamber in the longitudinal direction, illustrating a method for manufacturing an ink jet recording head.

With reference to FIG. 6H, in the step 4 (S4) of forming lead electrodes, a metal layer 91, for example, formed of gold (Au) is formed over the entire surface of the flow-passage-forming substrate wafer 110. The metal layer 91 is then patterned using a mask pattern (not shown), for example, formed of a resist to form the lead electrodes 90 corresponding to the piezoelectric elements 300.

Figure 6I:
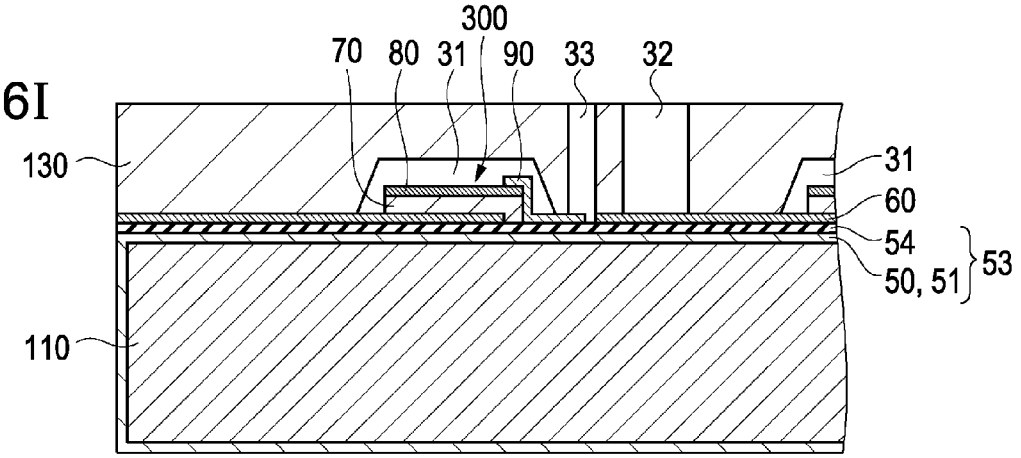
FIG. 6I is a cross-sectional view of a pressure-generating chamber in the longitudinal direction, illustrating a method for manufacturing an ink jet recording head.

With reference to FIG. 6I, in the step 5 (S5) of attaching a protective substrate, the piezoelectric elements 300 on the flow-passage-forming substrate wafer 110 are covered with a protective substrate wafer 130. The protective substrate wafer 130 is a silicon wafer and becomes a plurality of protective substrates 30.

The protective substrate wafer 130 has a thickness of approximately 400 μm, for example. Thus, the protective substrate wafer 130 greatly increases the rigidity of the flow-passage-forming substrate wafer 110.

FIGS. 6J to 7L illustrate the step 6 (S6) of etching a flow-passage-forming substrate.

Figure 6J:
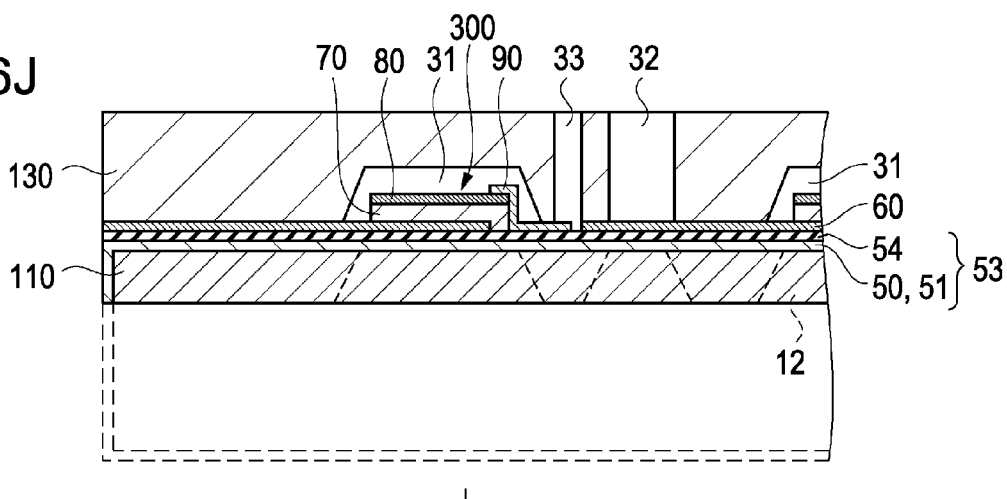
FIG. 6J is a cross-sectional view of a pressure-generating chamber in the longitudinal direction, illustrating a method for manufacturing an ink jet recording head.

With reference to FIG. 6J, the flow-passage-forming substrate wafer 110 is polished to a certain thickness and is subsequently wet-etched with a hydrofluoric acid-nitric acid mixture to a predetermined thickness. For example, the flow-passage-forming substrate wafer 110 can be etched to a thickness of approximately 70 μm.

Figure 7K:
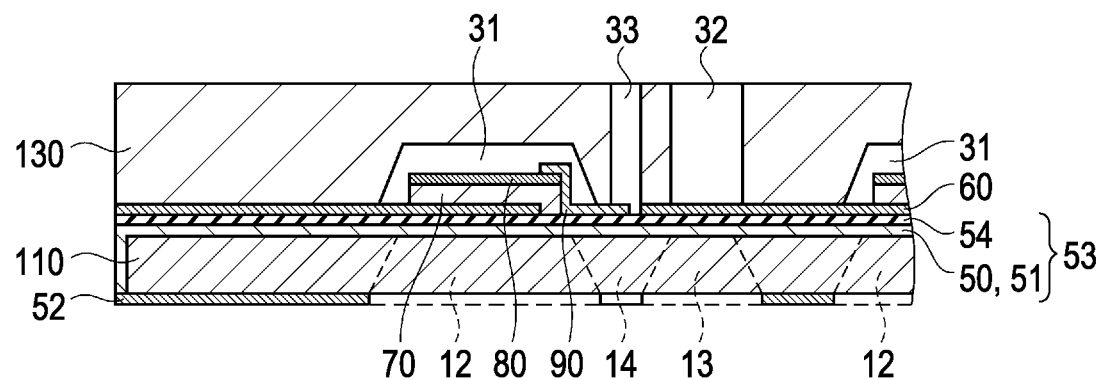
FIG. 7K is a cross-sectional view of a pressure-generating chamber in the longitudinal direction, illustrating a method for manufacturing an ink jet recording head.
Figure 7K:
Figure 7L:
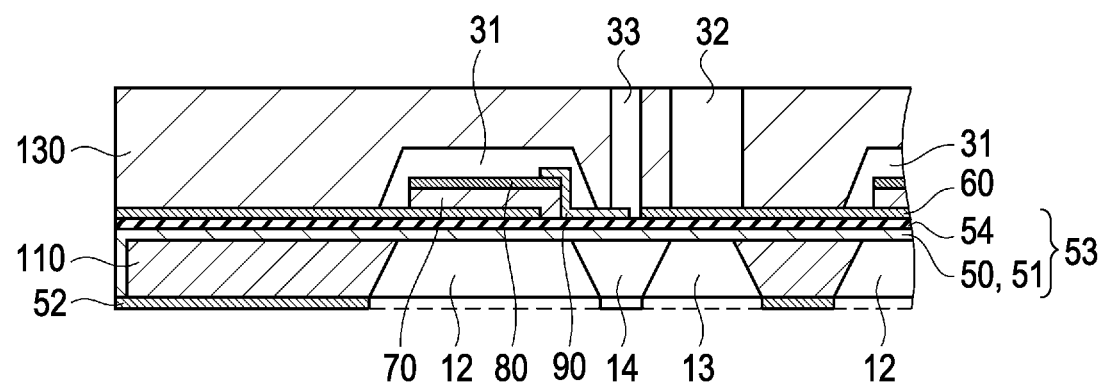
FIG. 7L is a cross-sectional view of a pressure-generating chamber in the longitudinal direction, illustrating a method for manufacturing an ink jet recording head.

With reference to FIGS. 7K and 7L, a mask film 52, for example, formed of silicon nitride (SiN) is formed on the flow-passage-forming substrate wafer 110 and is patterned in a predetermined shape. The flow-passage-forming substrate wafer 110 is then anisotropically etched using the mask film 52 to form the pressure-generating chambers 12, the communication portion 13, and the ink feed channels 14 in the flow-passage-forming substrate wafer 110.

Finally, unnecessary portions on the peripheries of the flow-passage-forming substrate wafer 110 and the protective substrate wafer 130 are removed, for example, by cutting, such as dicing. The side of the flow-passage-forming substrate wafer 110 opposite to the protective substrate wafer 130 is attached to the nozzle plate 20 having the nozzle openings 21. The protective substrate wafer 130 is attached to the compliance substrate 40. The flow-passage-forming substrate wafer 110 is then divided into the flow-passage-forming substrates 10 illustrated in FIGS. 1 and 2, thus manufacturing the ink jet recording head 1.

The ink jet recording head 1 is installed in an ink jet recording apparatus as one component of a recording head unit. The recording head unit includes an ink passage in communication with an ink cartridge serving as an ink supply unit.

Figure 10:
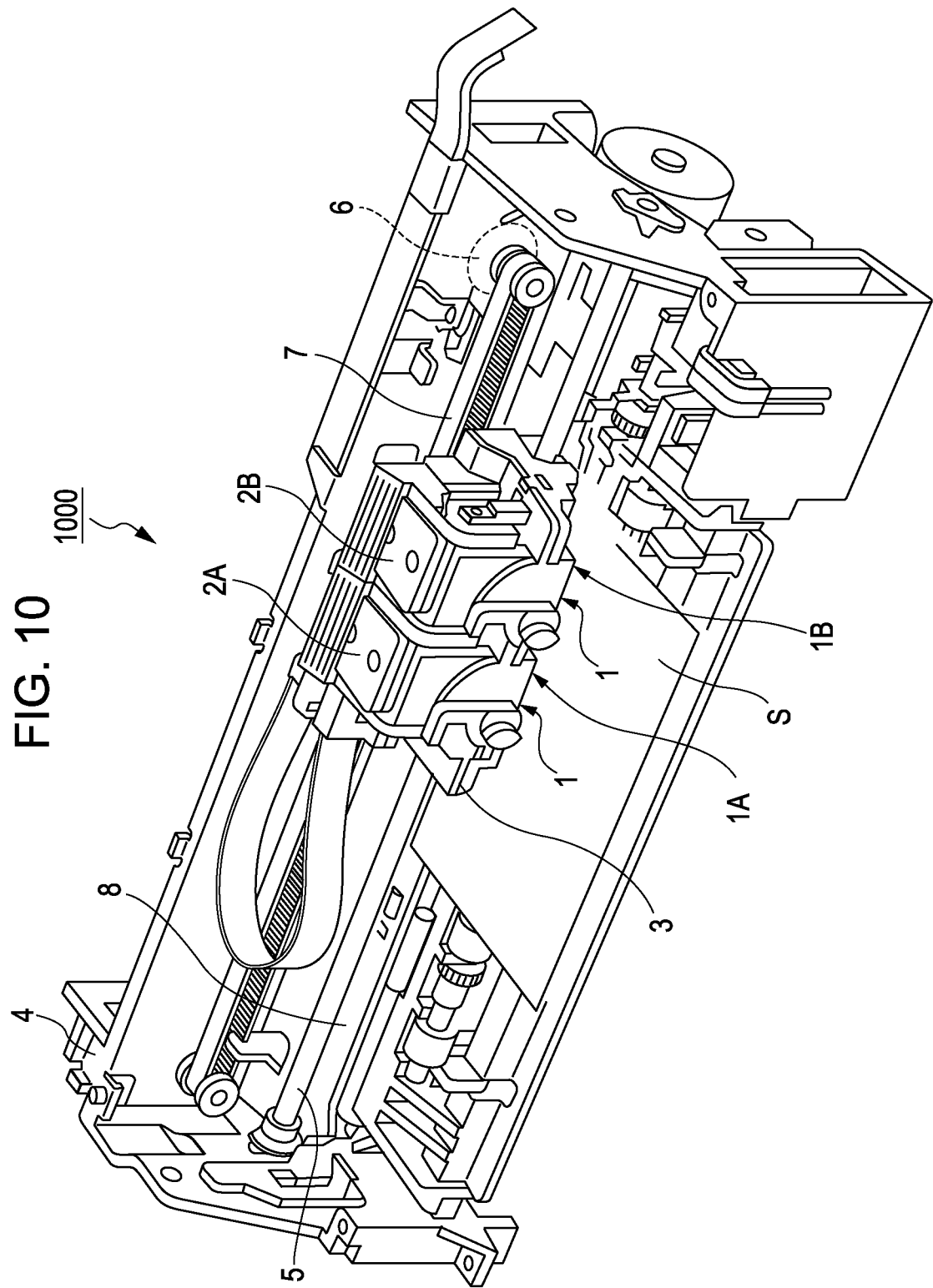
FIG. 10 is a schematic view of an ink jet recording apparatus according to an embodiment of the invention.

FIG. 10 is a schematic perspective view of an ink jet recording apparatus 1000 as an example of a liquid-ejecting apparatus according to the present embodiment.

The ink jet recording apparatus 1000 ejects liquid ink onto a recording medium, a recording sheet S, for recording.

The ink jet recording apparatus 1000 includes recording head units 1A and 1B, each of which has an ink jet recording head 1. The recording head units 1A and 1B include removable cartridges 2A and 2B, respectively. The removable cartridges 2A and 2B constitute an ink supply unit.

The ink jet recording heads 1 of the recording head units 1A and 1B face the recording sheet S and are not shown in FIG. 10.

A carriage 3 including the recording head units 1A and 1B is mounted on a carriage shaft 5 and can move along the carriage shaft 5. The carriage shaft 5 is fixed to the main body 4. For example, the recording head units 1A and 1B eject a black ink composition and a color ink composition, respectively.

When the driving force of a drive motor 6 is transferred to the carriage 3 via a plurality of gears (not shown) and a timing belt 7, the carriage 3 including the recording head units 1A and 1B moves along the carriage shaft 5.

The main body 4 includes a platen 8 along the carriage 3. The platen 8 can rotate by the driving force of a paper feed motor (not shown). The recording sheet S, such as a paper sheet, can be fed by a feed roller (not shown) and transported over the platen 8.

EXAMPLES

The step 3 (S3) of sputter etching illustrated in FIG. 5G is performed in the chamber 410 illustrated in FIG. 8. The degree of vacuum within the chamber 410 varies with the Ar gas flow rate as shown in FIG. 9.

Figure 11:
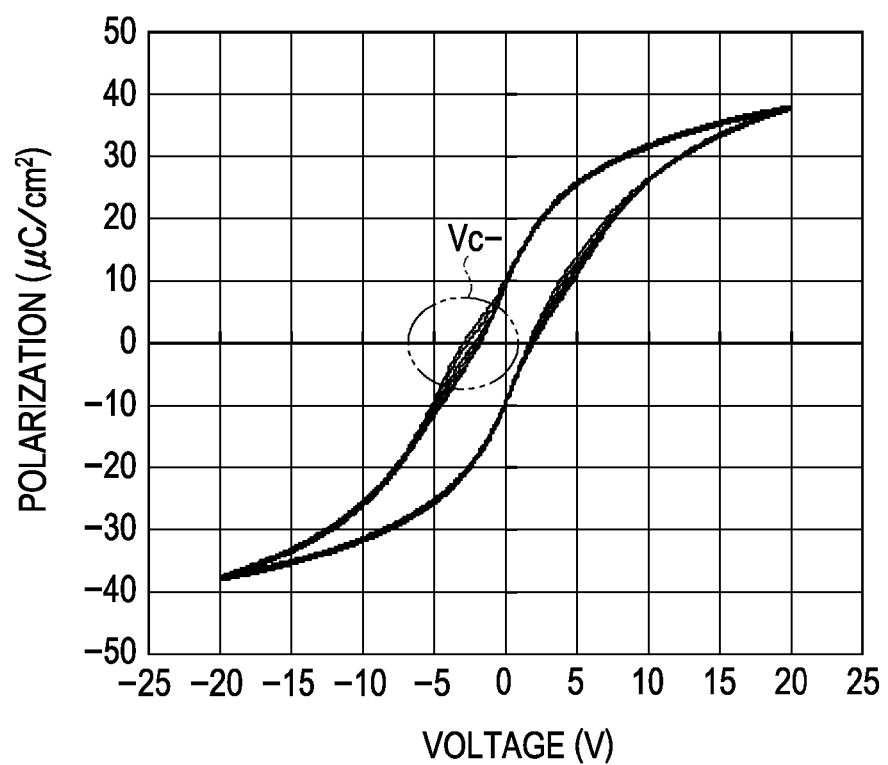
FIG. 11 is a graph showing the hysteresis curves of piezoelectric layers formed under different sputter etching conditions.

FIG. 11 shows the hysteresis curves of the piezoelectric layers 70 formed under different sputter etching conditions at different positions on the flow-passage-forming substrate wafer 110 illustrated in FIG. 5G. The horizontal axis represents voltage (V), and the vertical axis represents polarization (μC/cm$^2$).

FIG. 11 shows that the coercive voltage Vc− varies widely in the vicinity of −2 V. Variations in coercive voltage Vc− result in a high deformation reduction rate after a pulse endurance test.

Figure 12:
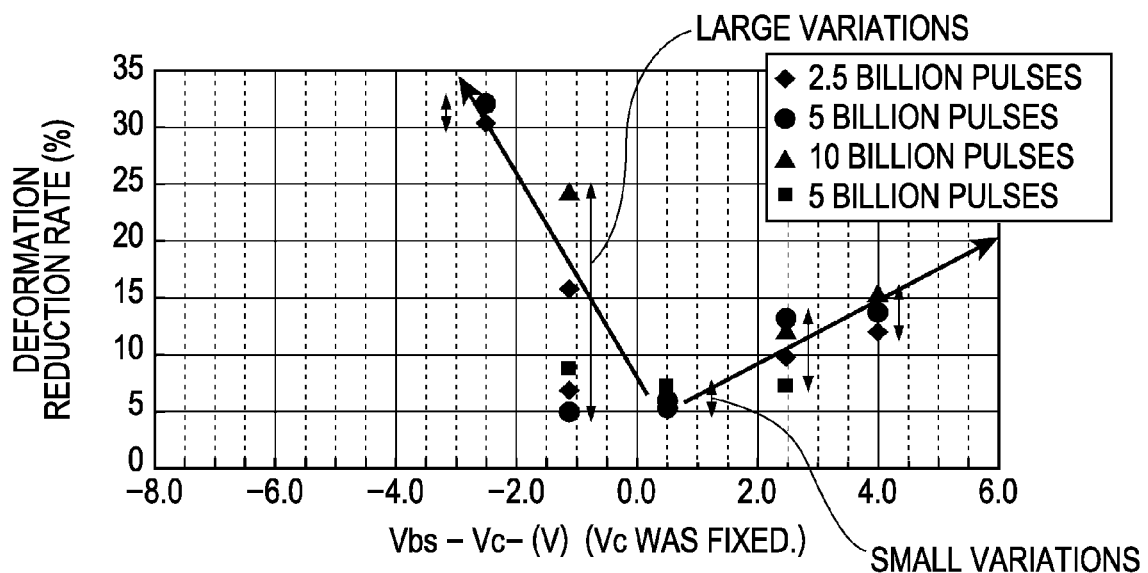
FIG. 12 is a graph showing the Vbs (V) dependency of the deformation reduction rate (%).

FIG. 12 shows the drive voltage dependency of the deformation reduction rate (%). The horizontal axis represents Vbs−Vc− (V), and the vertical axis represents the deformation reduction rate (%).

Figure 16:
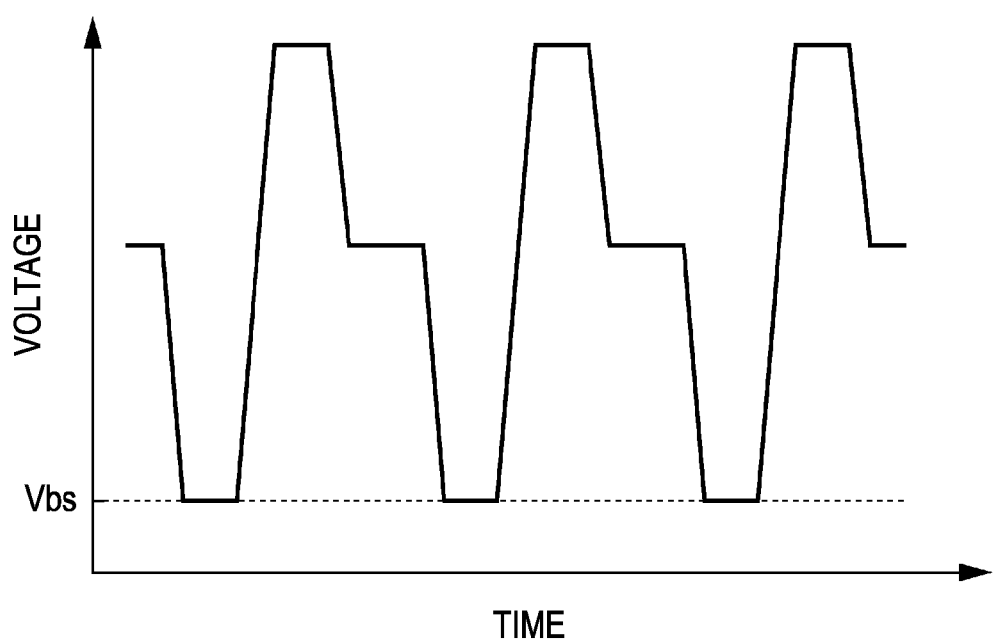
FIG. 16 is a graph showing a driving voltage waveform.

Vbs denotes the lowest voltage in the driving voltage waveform illustrated in FIG. 16. One sample after 2.5 billion pulses, two samples after 5 billion pulses, and one sample after 10 billion pulses were prepared.

In FIG. 12, the variation in deformation reduction rate is reduced as Vbs−Vc− approaches 0 V on the plus side. Vbs−Vc− approaching 0 V on the minus side, however, results in large variations in deformation reduction rate. In order to reduce variations in deformation reduction rate, large variations in Vc− must be compensated for by an increase in Vbs. However, this results in an increase in deformation reduction rate, as shown in FIG. 12. In contrast, small variations in Vc− allow Vbs to be reduced within the bounds of the variation in Vc−, thus reducing variations in deformation reduction rate.

Examples 1 to 3 will be described below.

Figure 13:
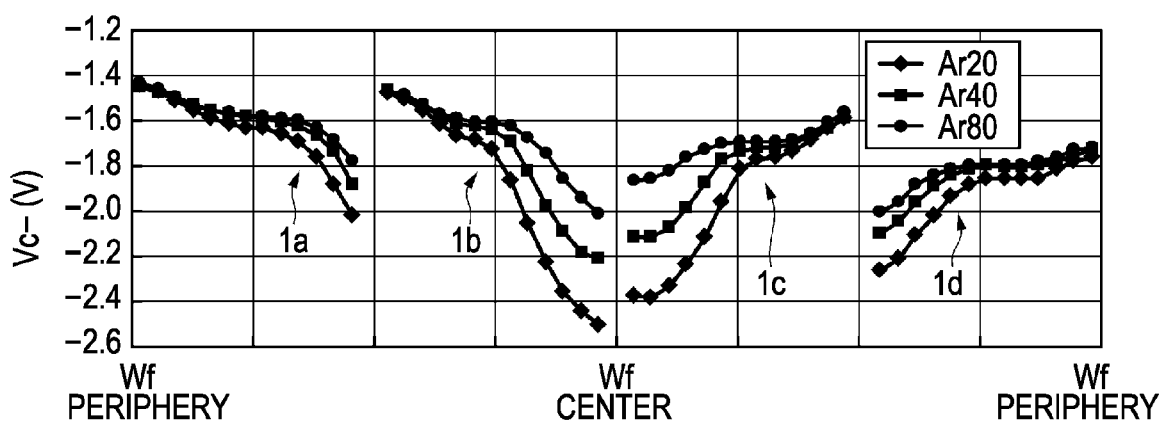
FIG. 13 is a graph showing the coercive voltage as one of hysteresis characteristics.

FIG. 13 shows the coercive voltage Vc− as one of hysteresis characteristics of piezoelectric layers 70 according to Examples 1 to 3. The horizontal axis represents the position of a piezoelectric layer 70 on a flow-passage-forming substrate wafer 110, and the vertical axis represents the coercive voltage Vc−.

The Ar gas flow rates were 20 sccm in Example 1, 40 sccm in Example 2, and 80 sccm in Example 3. In Examples 1 to 3, the input current to the magnetic coil 420 was 3.0 A, and the output current was 7.0 A. The sputter etching time was 124 seconds.

In FIG. 13, the positions of four ink jet recording heads 1 and the positions of piezoelectric elements 300 in one ink jet recording head 1 at intervals of five piezoelectric elements 300 on the flow-passage-forming substrate wafer 110 are shown along the horizontal axis. The four ink jet recording heads 1 were denoted as 1a, 1b, 1c, and 1d. The center on the horizontal axis corresponds to the center of the flow-passage-forming substrate wafer 110. A position closer to the ends on the horizontal axis corresponds to the position closer to the periphery of the flow-passage-forming substrate wafer 110.

In all the ink jet recording heads 1, an increase in Ar flow rate results in smaller variations in coercive voltage Vc− and a smaller distribution of hysteresis characteristics. An increase in Ar flow rate also results in smaller variations in coercive voltage Vc− and a smaller distribution of hysteresis characteristics between the ink jet recording heads 1.

The coercive voltage Vc− tends to decrease as the position approaches the center of the flow-passage-forming substrate wafer 110. This is probably because the concentration of plasma generated by the magnetic coil 420 is higher in the center than in the outer area. Discontinuous coercive voltages Vc− between the ink jet recording heads 1 are probably due to the presence of gaps between the ink jet recording heads 1 in the flow-passage-forming substrate wafer 110. The ink jet recording heads 1 are divided at the gaps, for example, by dicing.

Figure 14:
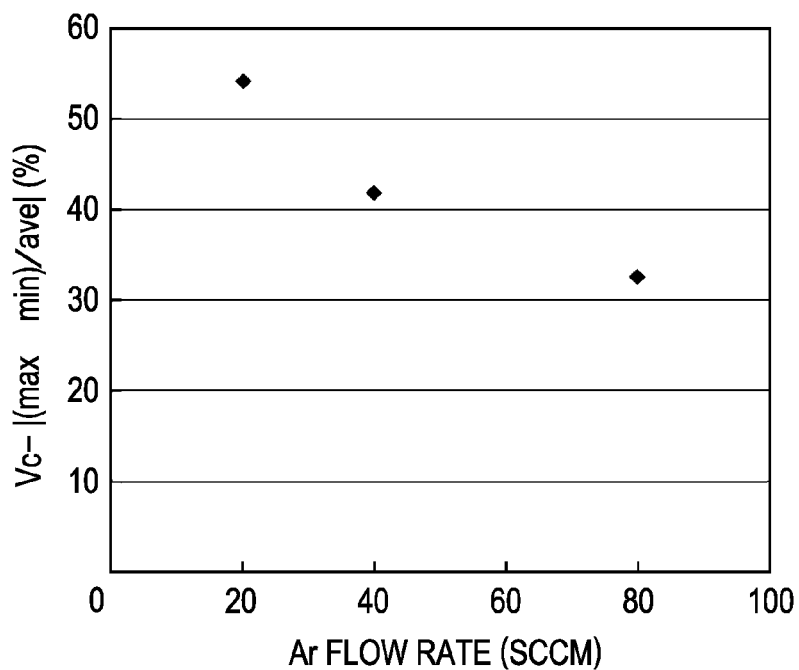
FIG. 14 is a graph showing the relationship between the Ar gas flow rate and the variation in coercive voltage.

FIG. 14 shows the relationship between the Ar gas flow rate and the variation in coercive voltage Vc−. The variation in coercive voltage Vc− on the vertical axis is the average of the maximum value and the minimum value of the coercive voltage Vc−. The horizontal axis represents the Ar gas flow rate.

FIG. 14 shows that the variation in coercive voltage Vc− decreases with increasing Ar gas flow rate.

The distribution of the amount of sputter etching as a function of the Ar gas flow rate was examined.

Figure 15:
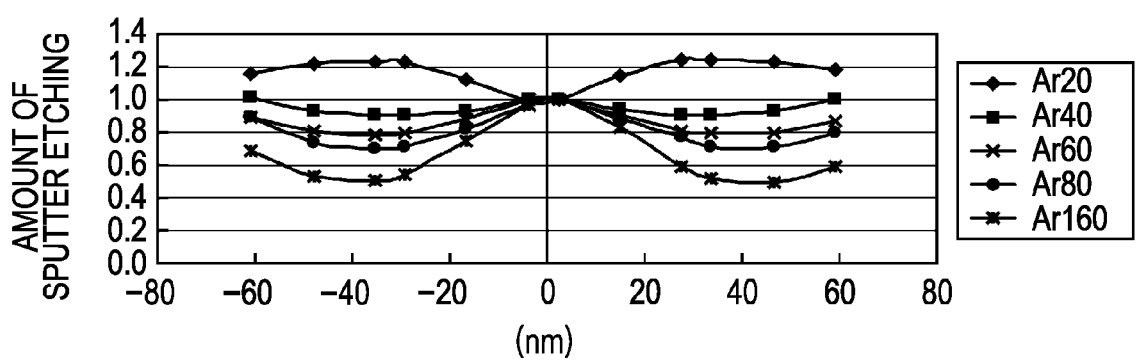
FIG. 15 is a graph showing the amount of sputter etching as a function of the position on a wafer.

FIG. 15 shows the amount of sputter etching as a function of the position on the flow-passage-forming substrate wafer 110. The horizontal axis represents the distance from the center of the flow-passage-forming substrate wafer 110. The vertical axis represents the ratio of the amount of sputter etching to the amount of sputter etching at the center. The Ar gas flow rates were 20, 40, 60, 80, and 160 sccm.

FIG. 15 shows that the variation in etching amount is large at an Ar gas flow rate of 160 sccm.

These embodiments demonstrate the following advantages.

(1) In sputter etching to improve the adhesion between the upper electrodes 80 and the lead electrodes 90, the sputter etching of surfaces of the upper electrodes 80 under an Ar gas flow at a flow rate of 60 sccm or more can reduce the residence time of Ar ions on the surfaces of the upper electrodes 80 because of the Ar gas flow. This can prevent the charging of the upper electrodes 80 due to the buildup of ionized Ar gas on the surfaces, reduce the influence of charging on the piezoelectric elements 300, and provide a method for manufacturing the piezoelectric actuator 100 that includes the piezoelectric elements 300 each including the piezoelectric layer 70 having smaller variations in hysteresis characteristics and deformation characteristics.

Furthermore, sputter etching under an Ar gas flow at a flow rate of 80 sccm or less can limit the etching amount, thereby reducing variations in the etching amounts of piezoelectric actuators 100.

(2) There is provided a method for manufacturing the piezoelectric actuator 100 having advantages described above. The piezoelectric actuator 100 includes the lower electrode 60 on the diaphragm 53 as a common electrode and the upper electrodes 80 on the piezoelectric layers 70 as individual electrodes.

Various modifications can be made in these embodiments and examples.

For example, while the ink jet recording head has been described as an example of a liquid-ejecting head in the embodiments and examples described above, the invention is directed to a wide variety of general liquid-ejecting heads and, as a matter of course, can be applied to liquid-ejecting heads for ejecting liquid other than ink.

Examples of other liquid-ejecting heads include recording heads for use in image recorders, such as printers, coloring-material-ejecting heads for use in the manufacture of color filters for liquid crystal displays, electrode-material-ejecting heads for use in the formation of electrodes for organic EL displays and field-emission displays (FED), and bioorganic-compound-ejecting heads for use in the manufacture of biochips.

The invention can also be applied to any actuator, including actuators installed as pressure generators in liquid-ejecting heads. For example, an actuator according to an aspect of the invention can be used in sensors, as well as heads described above.

What is claimed is:

1. A method for manufacturing a piezoelectric actuator, comprising:
   forming a diaphragm on a substrate;
   forming piezoelectric elements on the diaphragm, the piezoelectric elements including individual electrodes and piezoelectric layers;
   after the individual electrodes are formed, sputter-etching surfaces of the individual electrodes under an Ar gas flow at a flow rate in the range of 60 to 80 sccm; and
   forming lead electrodes on the surfaces of the individual electrodes.

2. The method for manufacturing a piezoelectric actuator according to claim 1, further comprising:
   forming a lower electrode on the diaphragm as a common electrode;
   forming the piezoelectric layers on the lower electrode or on the diaphragm; and
   forming upper electrodes on the piezoelectric layers as the individual electrodes.

* * * * *